US007084959B2

(12) United States Patent
Albert

(10) Patent No.: US 7,084,959 B2
(45) Date of Patent: Aug. 1, 2006

(54) COMPACT PULSE STRETCHER

(75) Inventor: Michael M. Albert, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 131 days.

(21) Appl. No.: 10/854,634

(22) Filed: May 27, 2004

(65) Prior Publication Data

US 2005/0264785 A1   Dec. 1, 2005

(51) Int. Cl.
*G03B 27/54* (2006.01)
*G03B 27/72* (2006.01)
*G01N 21/55* (2006.01)

(52) U.S. Cl. .......................... 355/67; 355/71; 356/447
(58) Field of Classification Search .................. 355/53, 355/71; 359/77, 641, 831; 356/447; 372/30
See application file for complete search history.

(56) References Cited

U.S. PATENT DOCUMENTS

| | | | |
|---|---|---|---|
| 5,309,456 A * | 5/1994 | Horton ........................ | 372/25 |
| 6,389,045 B1 | 5/2002 | Mann et al. .................. | 372/25 |
| 2005/0259701 A1* | 11/2005 | Albert ......................... | 372/30 |

FOREIGN PATENT DOCUMENTS

JP   6-214187   5/1994

OTHER PUBLICATIONS

Abstract of Japanese Patent No. 6-214187 (From: Patent Abstracts of Japan, Nov. 7, 1994, Section: P, Section No. 1822, vol. 18, No. 581, p. 91.).

* cited by examiner

*Primary Examiner*—William Perkey
*Assistant Examiner*—Kevin Gutierrez
(74) *Attorney, Agent, or Firm*—Sterne, Kessler, Goldstein & Fox P.L.L.C.

(57) ABSTRACT

A pulse stretcher includes a first prism and a second prism positioned opposite each other. A first coupling prism is optically coupled to the first prism with a partially reflective interface that directs a beam towards the second prism in a helical path. The first prism and the first coupling prism form a beamsplitter. A recirculating prism (or a reflective element) reflects the beam from the first prism into the second prism. Mirrors are positioned around the first and second prisms to permit recirculation of the beam through the first and second prisms. The beam recirculates through the first and second prisms using two or more helical paths. The pulse stretcher can be incorporated into a lithographic system.

39 Claims, 8 Drawing Sheets

702

COMPACT PULSE STRETCHER

BACKGROUND OF THE INVENTION

1. Field of the Invention

The present invention is related to pulse stretchers, and more particularly, to pulse stretchers for use in lithographic systems.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

A difficulty in designing optical components used in microlithography is caused by the high power density involved during exposure. High-powered lasers are often used as a source of illumination in lithographic systems. These lasers are usually pulsed lasers, which generate relatively short high intensity pulses. The high intensity pulses, over time, damage optical components, such as lenses used in the projection optics, requiring frequent replacement of these optical components. To reduce the effect of the high power density, pulse stretchers are often used in lithographic equipment. A pulse stretcher is a passive optical component that uses an arrangement of beam splitters to extend the duration of the pulse. Pulse stretchers can sometimes be cascaded, to multiply the effect of a single pulse stretcher. However, the volume of space available for the projection optical system with the lithographic tool is limited. Consequently, the volume of space available for the pulse stretcher is also limited, often precluding the use of a large number of cascaded pulse stretchers.

Thus, the purpose of the pulse stretcher is to maintain the energy of the pulse generally constant, while reducing peak intensities by spreading out the pulse in time.

The conventional systems use one or two beam splitters and a series of mirrors that split a single laser pulse into two strong pulses and a series of weaker pulses. Several pulse stretching devices can be used in tandem to produce more pulses over a longer time. See, e.g., Japanese patent JP6-214187 and U.S. Pat. No. 6,389,045.

The lithography industry is trying to achieve very large pulse stretching in order to extend the lifetime of the optics. With the conventional designs, the delay is so long that the delay path must be folded many times to fit in a reasonable volume. This creates alignment difficulties. Alternatively, many shorter delays can be applied in tandem, but this also requires many mirrors, which are difficult to align. Also, the limited number of "copies" of the pulse achievable with practical pulse stretcher designs leaves sharp peaks in the pulse profile. Further reduction of the peak intensities could be achieved if many overlapping pulses were produced, resulting in smoothing.

Accordingly, what is needed is a pulse stretcher that is compact and permits a significant stretching of the pulse from a lithographic illumination source.

SUMMARY OF THE INVENTION

The present invention is directed to a compact pulse stretcher that substantially obviates one or more of the problems and disadvantages of the related art.

One aspect of the present invention includes a pulse stretcher with a first prism and a second prism positioned opposite each other. A first coupling prism is optically coupled to the first prism with a partially reflective interface that directs a beam towards the second prism in a helical path. The first prism and the first coupling prism form a beamsplitter. A recirculating prism (or a reflective element) reflects the beam from the first prism into the second prism. Mirrors are positioned around the first and second prisms to permit recirculation of the beam through the first and second prisms. The partially reflective interface is about 80–95% reflective. The beam recirculates through the first and second prisms using two or four (or more) helical paths. The mirrors include convex and concave mirrors. The first and second prisms and the recirculating prism can be a unitary component. The second prism can have at least one powered surface for telescoping the beam to a desired size. The helical path can have two left handed helixes, and two right handed helixes. The pulse stretcher can be incorporated into a lithographic system that is arranged, in order of light propagation, with an illumination source, the pulse stretcher, illumination optics, a reticle, and projection optics.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

To achieve a compact pulse stretcher, two prisms (or a single cube) can be used to fold an input beam into a loop that constitutes the delay path. By angling the input beam in the third dimension orthogonal to the plane of the loop, the beam follows a shallow helical path, thus allowing the same delay optics to be used several times. As many as four possible independent helical paths through the delay loop may be obtained by reintroducing the beam with the optics, and a single compact set of delay optics with a relatively small delay per each loop can effectively provide a very long delay. A coupling prism on one face extracts a small part of the beam at each loop, producing many delayed pulses that result in both stretching and smoothing of the pulse. The pulses are also spatially separated, but can be mixed back together by an illuminator.

Figure 1:
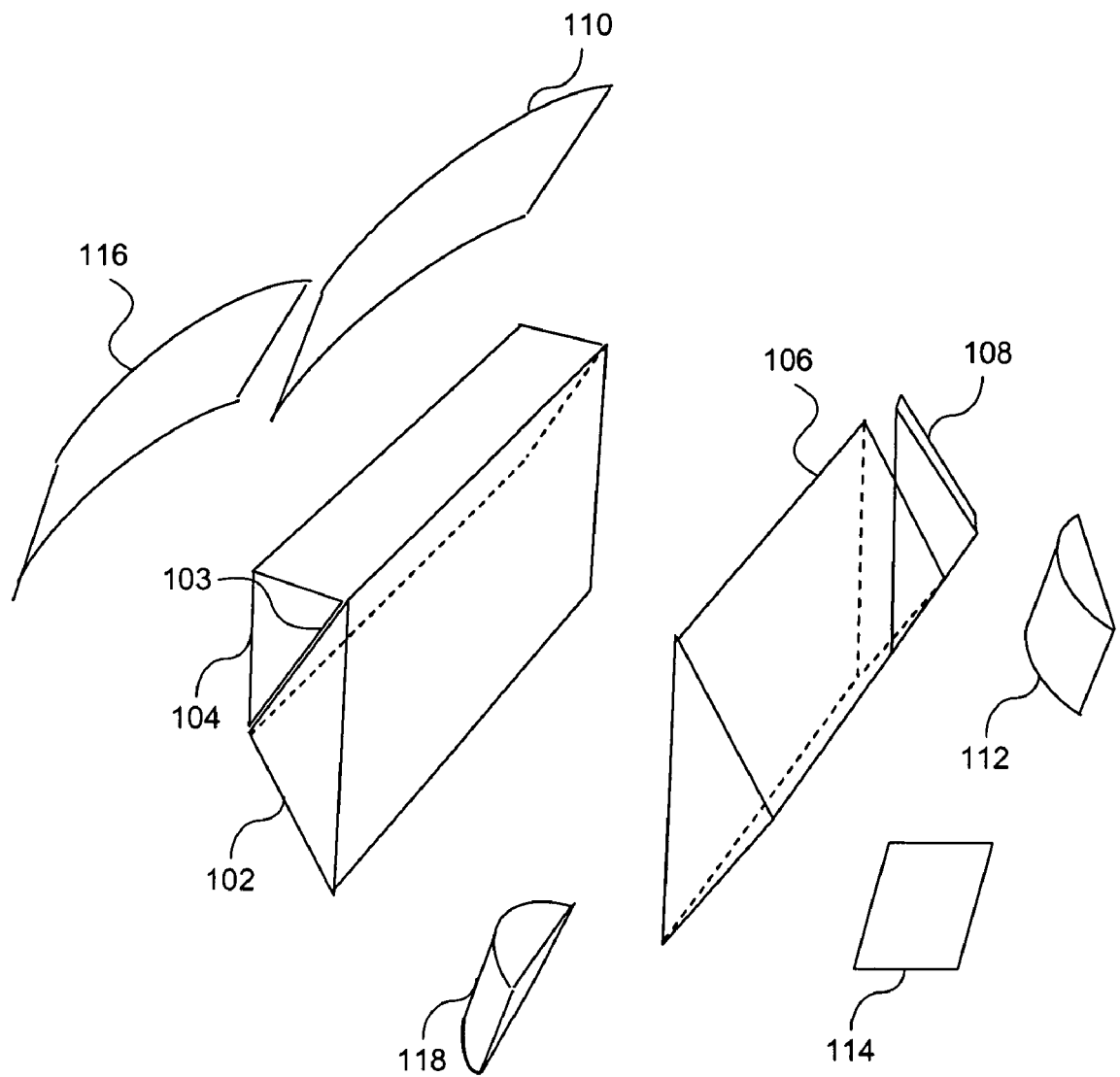
FIG. 1 illustrates one exemplary arrangement of optical components of the present invention.

FIG. 1 illustrates an exemplary arrangement of optical components of the present invention. For clarity, FIG. 1 illustrates just the components without the beam paths, and FIGS. 2–6 illustrate various portions of the beam paths through the components shown in FIG. 1. As shown in FIG. 1, one exemplary arrangement includes a prism 102 with a coupling interface 103, such that the interface 103 is approximately 80–95% reflective. A second (coupling) prism 104 is coupled to the prism 102, as shown in FIG. 1. A third prism 106 is arranged opposite the prism 102. A recirculator prism 108 is positioned to the side of the prism 106. A first convex cylindrical mirror 112 is used for telescoping a beam back to its original size. A flat mirror 114 is also used for redirecting the beam, as will be further described in subsequent figures. Similarly, a second convex cylindrical mirror 118 is also used to telescope the beam back to its original size. Concave cylindrical mirror 116 and mirror 110 are similarly used to reflect the beam and to telescope it back to a desired size.

Figure 2:
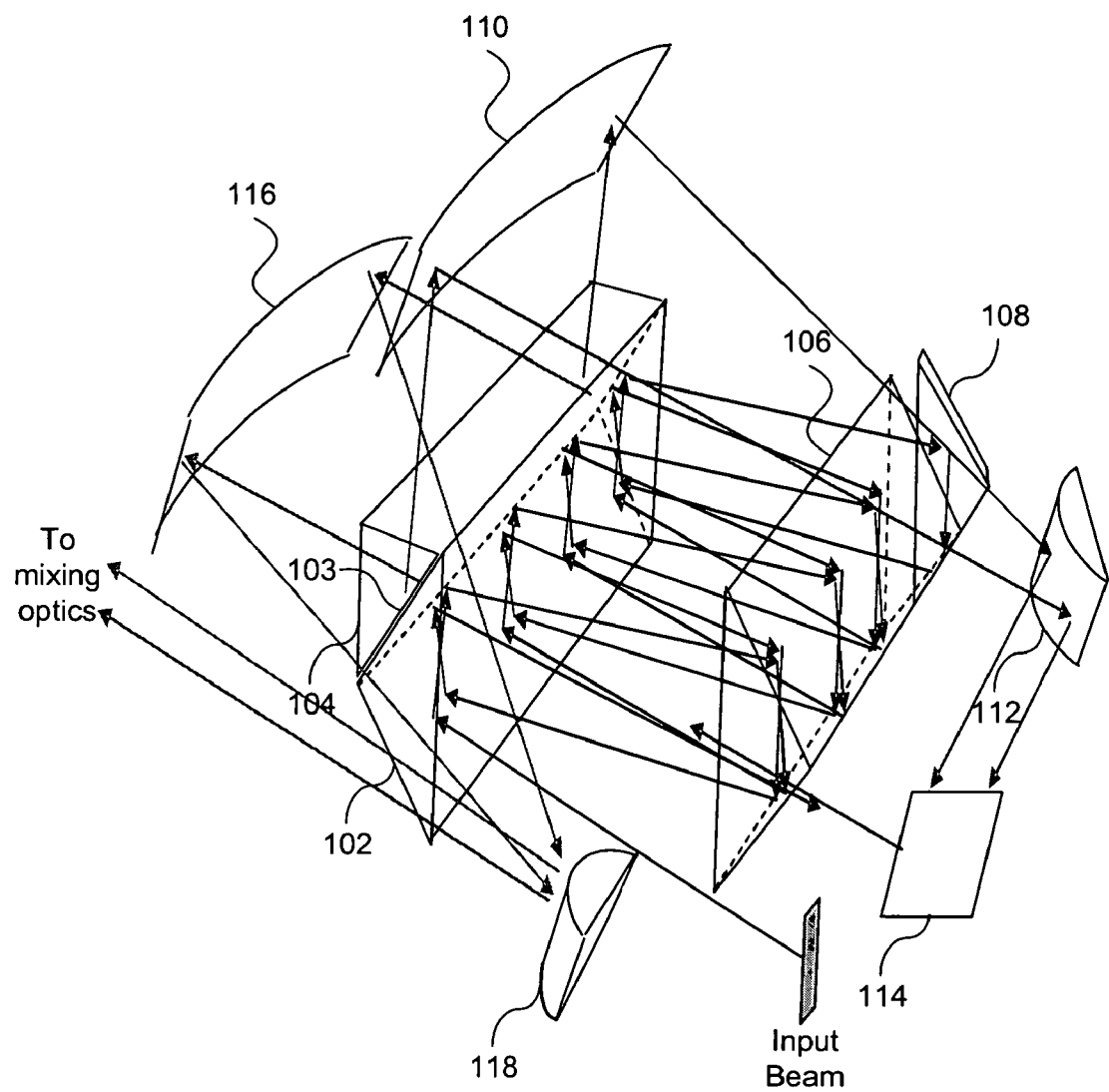
FIGS. 2–6 illustrate beam paths in the optical system illustrated in FIG. 1.

FIG. 2 illustrates the beam paths in the components of FIG. 1. FIG. 2 illustrates all of the beam paths at the same time, and the subsequent figures illustrate only a portion of the beams of FIG. 2, for clarity (FIGS. 3–6). These FIGS. 1–6 should all be kept in mind together, during the description below.

It should also be understood that although the description below is in terms of the structure shown in FIG. 1, the sense of direction in the description (i.e., up, down, left, right) is purely arbitrary, since the arrangement of optical components shown in FIG. 1 can be oriented in any arbitrary direction in an actual system. Furthermore, as is clear to one of ordinary skill in the art, additional mirrors, not shown in these figures, may be used to fold the optical path.

Figure 3:
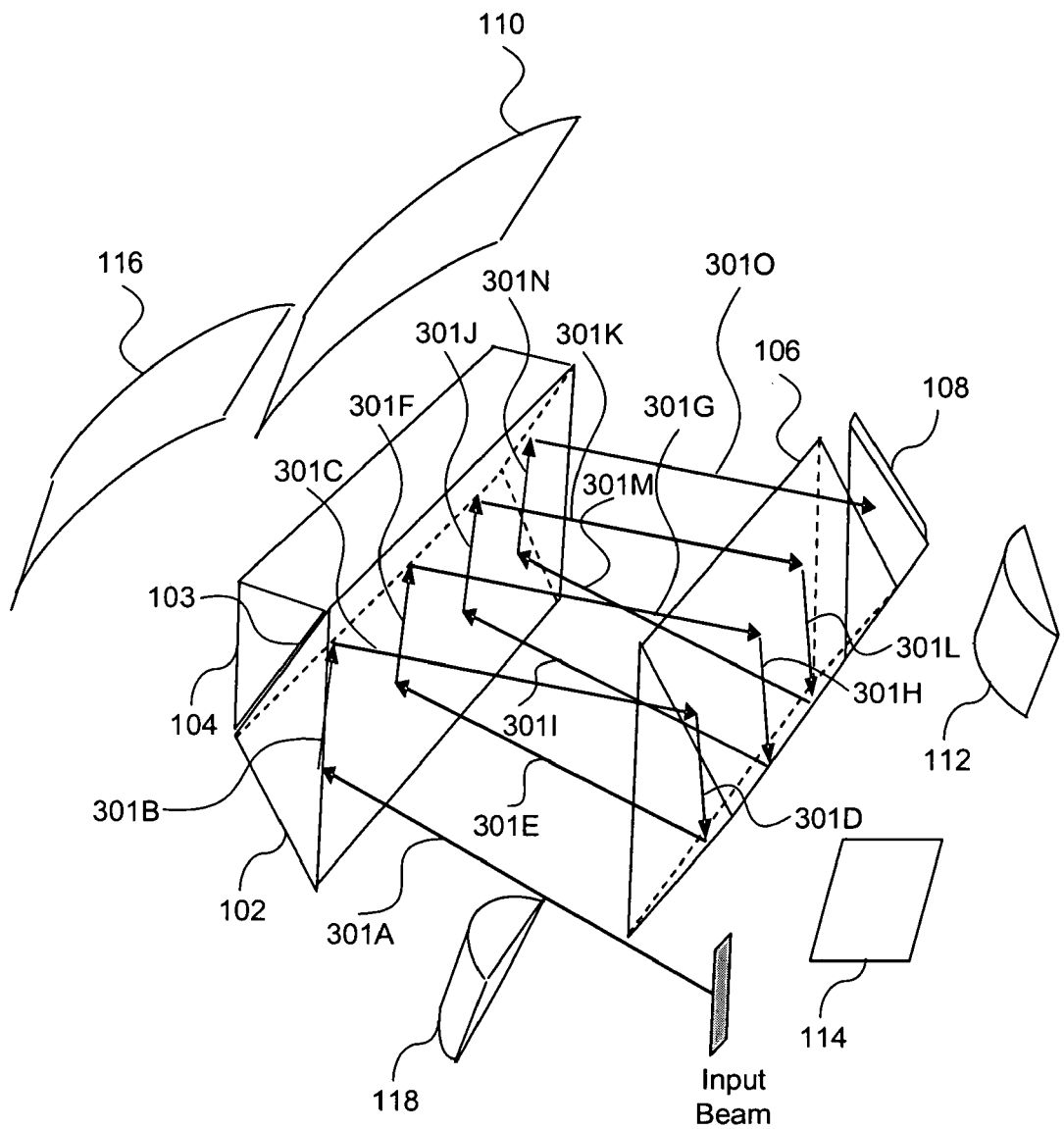

As shown in FIG. 3, an input beam is directed towards the prism 102. The input beam is shown as a beam with a rectangular cross section and the first beam that "hits" the prism 102 is beam 301A. The beam 301A is then reflected upwards (301B) and then to the right towards the prism 106 (see beam 301C). Note that the interface 103, as discussed above, is approximately 80–95% reflective, thus, most of the beam traveling upwards (beam 301B) is reflected to the right towards the prism 106, however, a portion of the beam (not shown in FIG. 3, but see FIG. 5), is transmitted into and through the coupling prism 104.

As further shown in FIG. 3, the beam continues to be reflected back and forth between the prisms 102, 104 and 106, in a helical path. This is illustrated by the beams segments 301D–301O. Note that in this case, the combination of components 102 and 104, with the interface 103, acts as a beam splitter (but in this case, usually not a 50% beam splitter). Thus, the beam path 301B–301O, as shown in FIG. 3, illustrates a single helical path utilizing the prisms 102 and 106.

Figure 5:
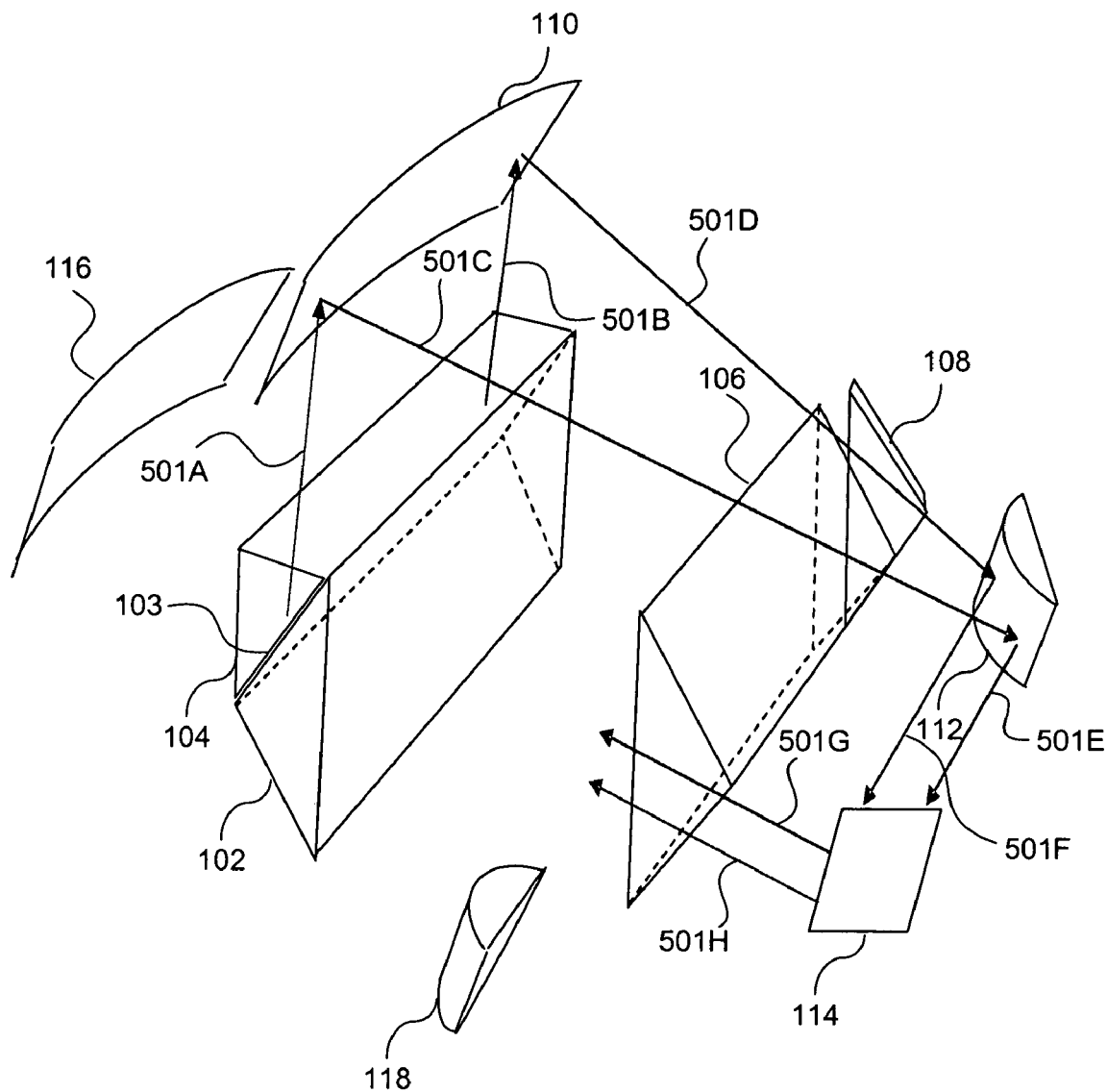

With further reference to FIG. 5, beams 501A, 501B are shown, which are the result of the partial transmittance through the interface 103 and the prism 104. In this figure, only the transmitted beams from the first upward beam 301B and the last upward beam 301N are shown, although it will be understood by one of ordinary skill in the art that every reflection of the upwards-traveling beams in FIG. 3 at the interface 103 results in a partially transmitted beam. As further shown in FIG. 5, the beams 501A, 501B are reflected by the mirror 110 as beams 501C and 501D respectively, towards the mirror 112. The beams 501C, 501D are then reflected off the mirror 112 as beams 501E, 501F, towards the mirror 114. The beams are then reflected from the mirror 112 towards the prism 102 for what will become a second helical pass (see beams 501G and 501H, respectively).

Thus, it may be said that the mirrors 110, 112 together constitute a telescope. Note that the beams 501H, 501G in FIG. 5 are parallel to the original input beam 301A, shown in FIG. 3, but they are "higher" than the original beam 301A. Thus, in this case, when the beams 501G, 501H reach the interface 103, they are reflected downwards, not upwards, allowing to "reuse" the pair of prisms 102, 106 a second time. (This helical beam path is not shown in the figures).

Figure 4:
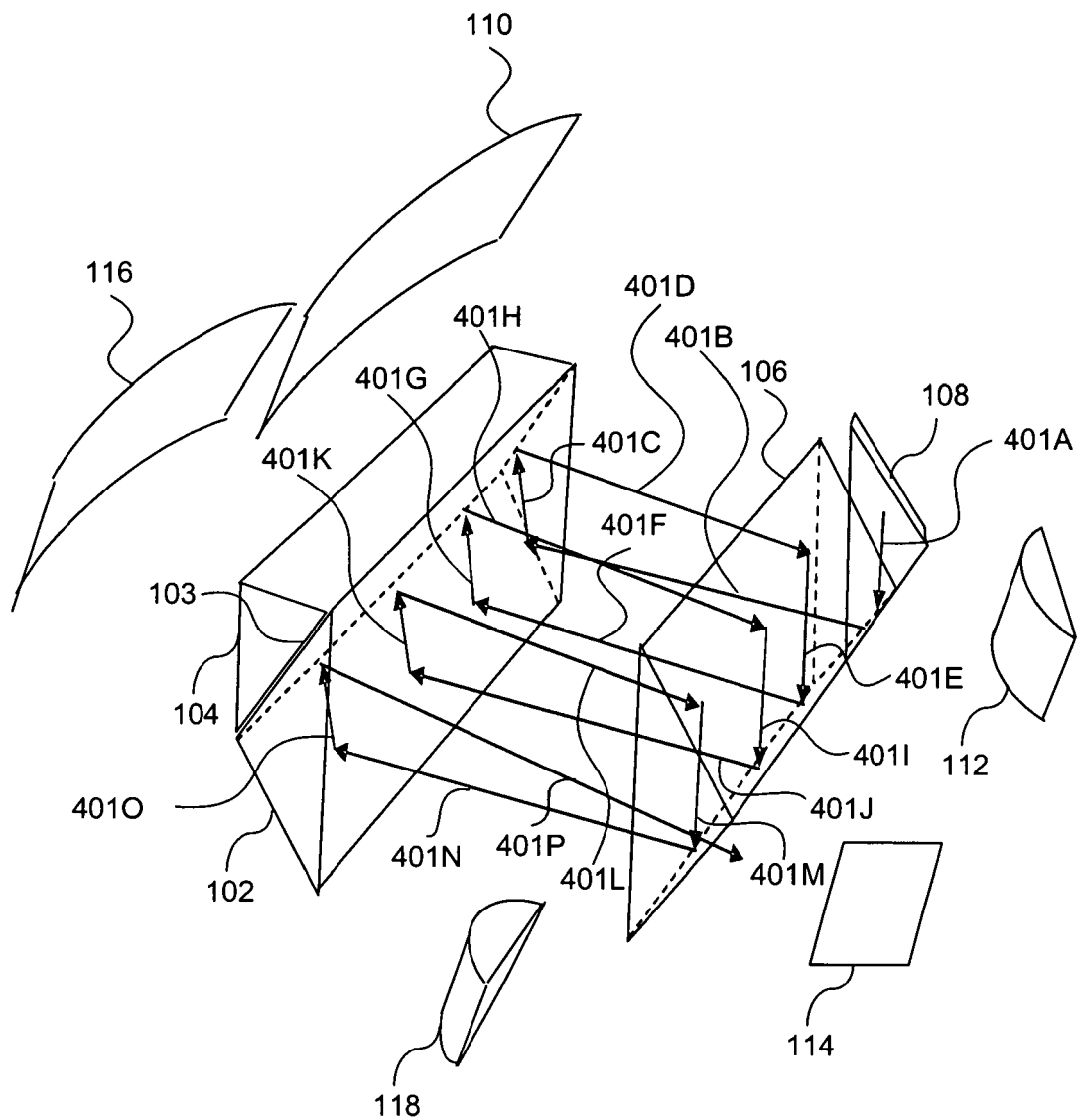
Figure 6:
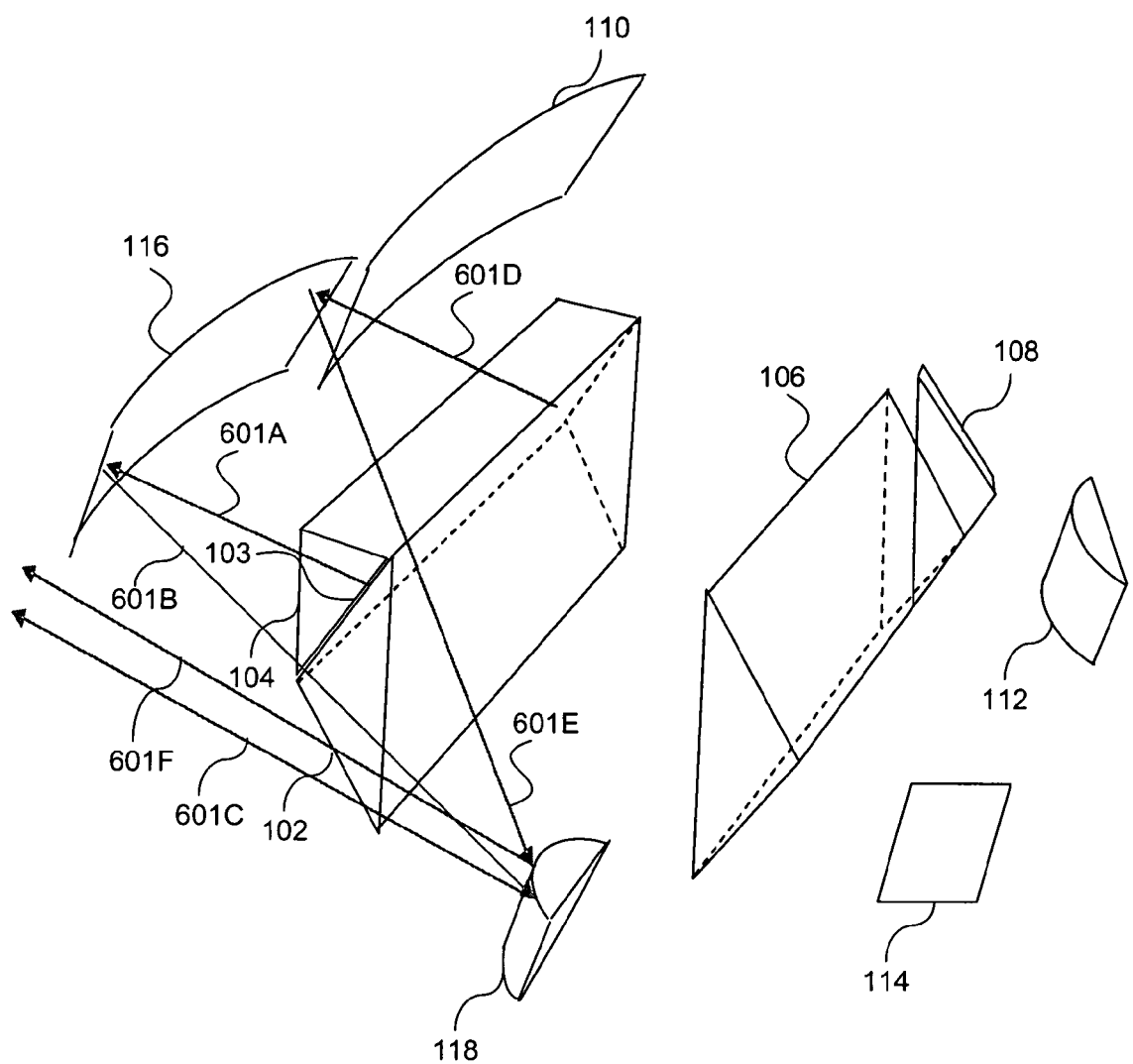

FIG. 4 illustrates the use of the recirculating prism 108, which is shown as a separate optical component in FIG. 4, but may alternatively be just a reflecting facet. As shown in FIG. 4, the beam 401A, which is a continuation of the beam 301G shown in FIG. 3, first is directed downwards. The beam then continues in a helical path (see beams 401B–401P) using the two prisms 102 and 106, similar to the beam path of FIG. 3. As with the beam 301A–301O, when the upwards-traveling beams 401C, 401G, 401K and 401O interact with the interface 103, most of the energy of the beams is reflected as shown in FIG. 4, but a portion of the energy of the beams is transmitted, which is illustrated in FIG. 6 as beams 601D and 601A (only some of the transmitted beams are shown in FIG. 6 for clarify). The beams 601D, 601A are reflected off the mirror 116 as beam 601E, 601B, respectively, towards the mirror 118 and are then reflected as beams 601F, 601C toward mixing optics (not shown). Here, 601C, 601F represent the output of the entire optical system. Note that, as with mirrors 110, 112, mirrors 116, 118 together form a telescope that compresses the cross-sectional dimension of the beam back to its original (or, alternatively, some other desired) size.

Thus, it will be appreciated that the beam path 401B–401P of FIG. 4 is a helix with the opposite "handedness" compared to FIG. 3. In other words, if the helix 301B–301O of FIG. 3 is thought of as a "right-handed" helix, then the helical path 401B–401P of FIG. 4 is a "left-handed" helix.

Note that the same helical reflection can be done with the reintroduced beam designated in FIG. 5 as 501G, 501H. In other words, the optical components of FIG. 1 can be used for a total of four helical passes through the prisms 102, 106.

Two of the four passes are achieved using retroreflection. In other words, in a relatively compact optical system, due to the reintroduction of the beams back into the prisms 102, 106, multiple passes through the pulse stretcher may be obtained. Note that beam divergence also can be counteracted by, e.g., putting power on the faces of the prisms 102 and/or 106 and/or 108. Alternatively, mirrored surfaces may be used instead of prisms, with the surfaces positioned where the prism facets are shown in FIG. 1. It is believed, however, that the prism embodiment is preferable from a manufacturing and alignment perspective.

Additionally, other powered elements may be introduced to counteract the beam divergence. E.g., powered elements, such as lenses, may be introduced between the prisms 102 and 106. Alternatively, and/or in addition to such lenses, powered elements may be introduced in the other beam paths shown in FIGS. 3–6. For example, a lens can be placed between mirrors 112 and 114, to compensate for beam divergence. Thus, the present invention allows the reuse of a very compact pulse stretcher multiple times, in order to smooth out and stretch out the pulse.

Note that although in the description above, four independent helical paths through the prisms 102 and 106 are utilized, it also possible to use only two of the four paths, if desired.

Although only a single coupling prism 104 is shown in FIG. 1, it is possible to add a second such component on the lower surface of the prism 102, i.e., coupled to the rear lower surface (in FIG. 1) of the prism 102. This would produce another set of half-delayed pulses. These half-delayed pulses can be mixed with the first set of pulses (beams) illustrated in the figures.

Additionally, one or two similar coupling prisms (not shown in figures, similar to coupling prism 104) can be placed on the rear surfaces of the prism 106.

Figure 7:
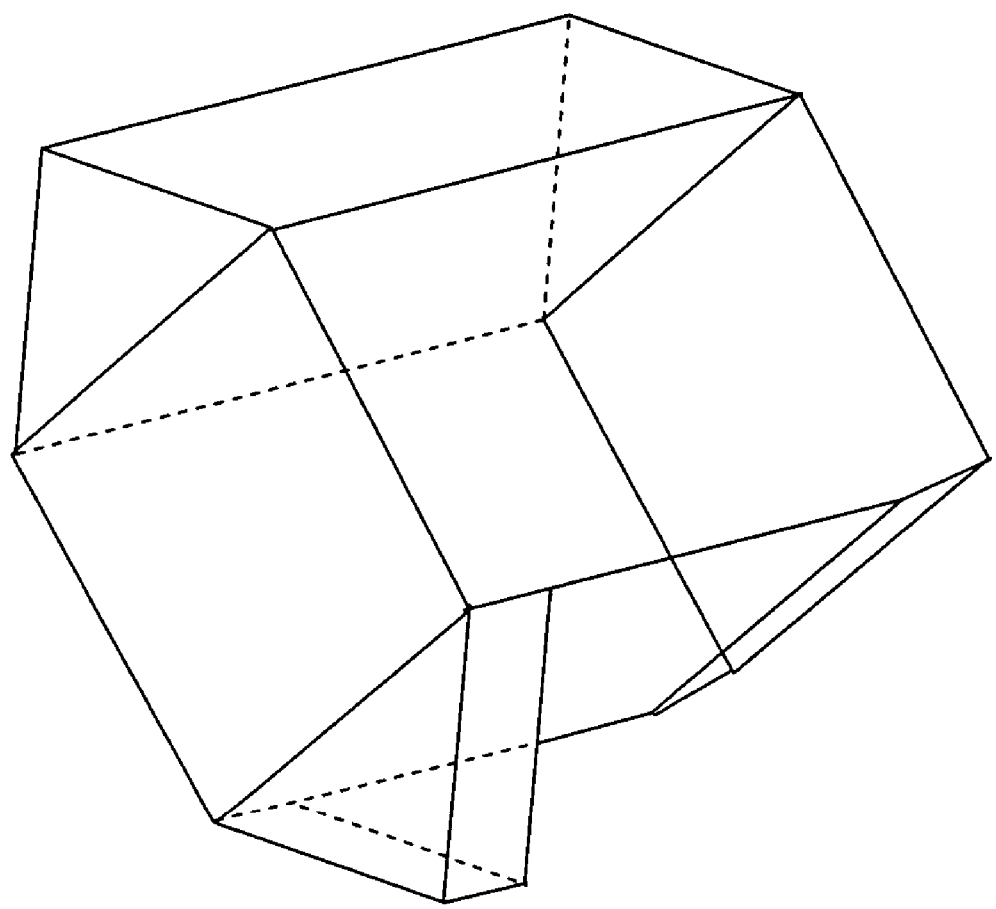
FIG. 7 illustrates how some of the optical components of FIG. 1 may be manufactured as a unitary component.

FIG. 7 illustrates how a number of components illustrated in FIG. 1 can be manufactured as a single unitary optical component 702. Specifically, the component 702 illustrated in FIG. 7 is a combination of prisms 102, 104, 106 and 108. There may be manufacturing advantages to being able to use the single component 702 in place of manufacturing several separate components. Also, there may be alignment and assembly advantages to such an approach. Alternatively, prisms 102, 106 and 108 can be manufactured as a single component, and the prism 104 attached to the interface 103 using well-known methods, such as bonding, etc.

Figure 8:
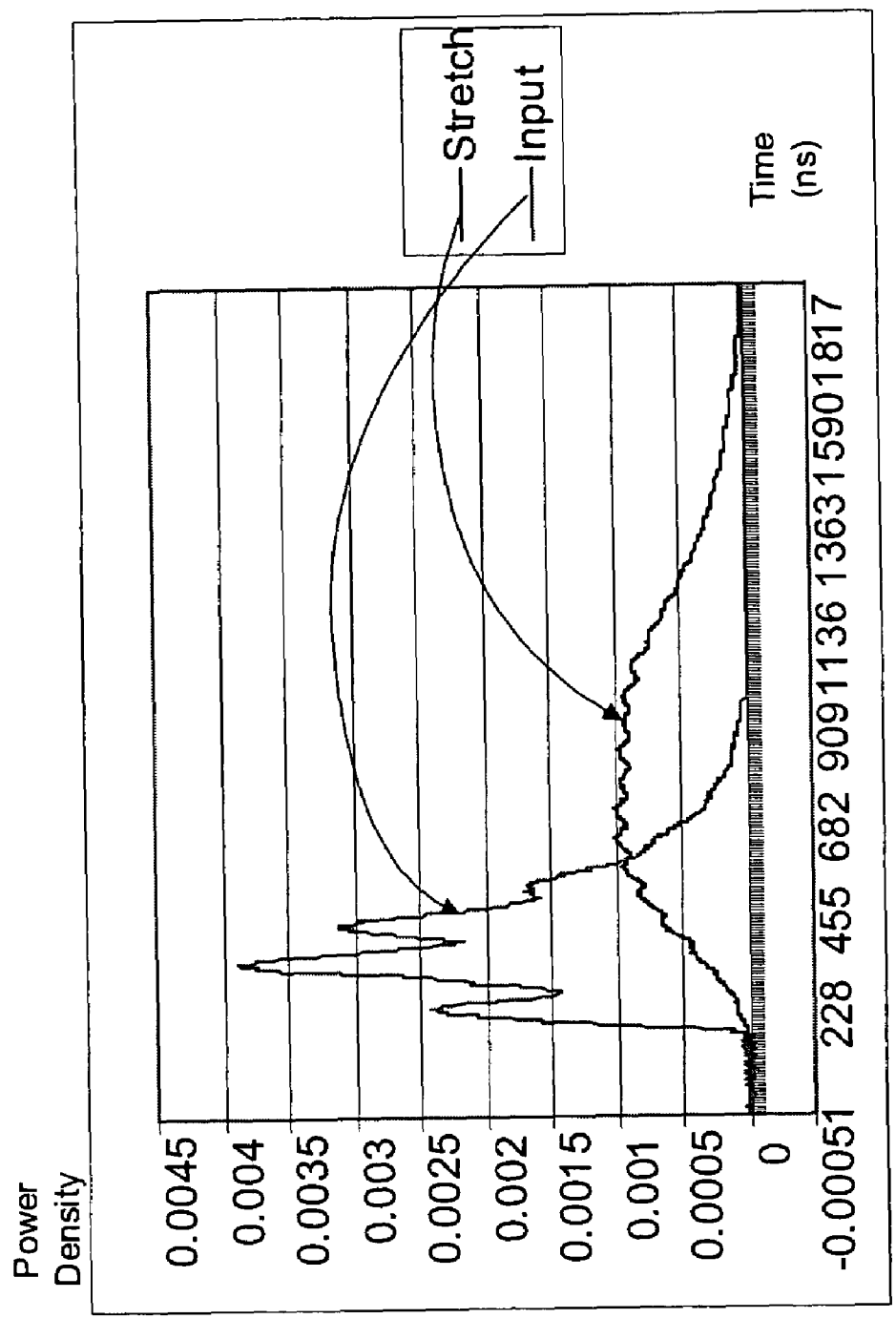
FIG. 8 illustrates the effect of the optical system of FIG. 1 on pulse profile.

FIG. 8 illustrates the effect of the pulse stretcher shown in FIG. 1 on a pulsed beam. As shown in FIG. 8, the original input pulse has several sharp peaks. The output pulse, which is stretched, is much smoother and has a wider full width half maximum (FWHM) pulse width. Note that the graph of FIG. 8 assumes the following conditions:

no recirculating prism 108 (i.e. only once down the length, then compress and no second pass) which allows power in the surfaces so the beam does not grow in size;

2% loss per loop (4 anti-reflective transmissions+14 cm path in glass);

20% output coupling per loop. Final loop coating is transparent;

main prisms have 50 mm legs, length is 70 mm;

prisms are spaced at 1 m.

Overall efficiency=85%. FWHM pulse width is stretched from 45 ns to 120 ns (2.6 times). Peak intensity is reduced by a factor of 3.9.

The choice of parameters can be tailored to achieve longer stretching, or higher efficiency, or better smoothing (usually one of the three at the expense of the other two).

Although the delay per loop is small, a long delay is generated by multiple loops. This allows the stretcher to be very compact while still providing the required delay. With very few components and roof prisms, alignment is simplified. Many "copies" of the pulse with a short delay between each copy provide smoothing as well as stretching. This further reduces sharp peaks.

CONCLUSION

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A pulse stretcher comprising:
   a first prism and a second prism positioned opposite each other;
   a first coupling prism optically coupled to the first prism with a partially reflective interface that directs a beam towards the second prism in a helical path;
   a recirculating prism that reflects the beam from the first prism into the second prism; and
   a plurality of mirrors positioned around the first and second prisms to permit recirculation of the beam through the first and second prisms.

2. The pulse stretcher of claim 1, wherein the partially reflective interface is about 80–95% reflective.

3. The pulse stretcher of claim 1, wherein the beam recirculates through the first and second prisms using at least two helical paths.

4. The pulse stretcher of claim 1, wherein the beam recirculates through the first and second prisms using at least four helical paths.

5. The pulse stretcher of claim 1, wherein the plurality of mirrors includes at least one convex mirror.

6. The pulse stretcher of claim 1, wherein the plurality of mirrors includes at least one concave mirror.

7. The pulse stretcher of claim 1, wherein the plurality of mirrors telescopes the beam to a desired size.

8. The pulse stretcher of claim 1, wherein the first and second prisms and the recirculating prism form a unitary component.

9. The pulse stretcher of claim 1, wherein the second prism has at least one powered surface for telescoping the beam to a desired size.

10. The pulse stretcher of claim 1, wherein the plurality of mirrors includes at least two convex mirrors.

11. The pulse stretcher of claim 1, wherein the plurality of mirrors includes at least two concave mirrors.

12. The pulse stretcher of claim 1, further comprising a second coupling prism optically coupled to the first prism with a second partially reflective interface that directs a beam towards the second prism.

13. The pulse stretcher of claim 1, further comprising a second coupling prism optically coupled to the second prism with a second partially reflective interface that directs the beam towards the first prism.

14. The pulse stretcher of claim 1, further comprising a third coupling prism optically coupled to the second prism with a third partially reflective interface that directs the beam towards the first prism.

15. The pulse stretcher of claim 1, further comprising at least one lens in a path of the beam to counteract divergence of the beam.

16. The pulse stretcher of claim 1, wherein the helical path includes two left handed helixes, and two right handed helixes.

17. A lithographic system comprising, in order of light propagation:
   an illumination source;
   a pulse stretcher;
   illumination optics;
   a reticle; and
   projection optics,
   wherein the pulse stretcher comprises:
      a first prism and a second prism positioned opposite each other,
      a first coupling prism optically coupled to the first prism with a partially reflective interface that directs a beam towards the second prism in a helical path,
      a recirculating prism that reflects the beam from the first prism into the second prism, and
      a plurality of mirrors positioned around the first and second prisms to permit recirculation of the beam through the first and second prisms.

18. The lithographic system of claim 17, wherein the partially reflective interface is about 80–95% reflective.

19. The lithographic system of claim 17, wherein the beam recirculates through the first and second prisms using at least two helical paths.

20. The lithographic system of claim 17, wherein the beam recirculates through the first and second prisms using at least four helical paths.

21. The lithographic system of claim 17, wherein the plurality of mirrors telescopes the beam to a desired size.

22. The lithographic system of claim 17, wherein the first and second prisms and the recirculating prism form a unitary component.

23. The lithographic system of claim 17, wherein the second prism has at least one powered surface for telescoping the beam to a desired size.

24. The lithographic system of claim 17, wherein the plurality of mirrors includes at least two convex mirrors.

25. The lithographic system of claim 17, wherein the plurality of mirrors includes at least two concave mirrors.

26. The lithographic system of claim 17, wherein the helical path includes two left handed helixes, and two right handed helixes.

27. A pulse stretcher comprising:
   a beamsplitter and a prism positioned opposite each other, wherein the beamsplitter includes a partially reflective interface that directs a beam towards the prism;
   a reflective element that reflects a beam from the beamsplitter into the prism; and
   a plurality of mirrors positioned around the beamsplitter and the prism to permit a helical path of the beam between the beamsplitter and the prism and recirculation of the beam through the beamsplitter and the prism.

28. The pulse stretcher of claim 27, wherein the partially reflective interface is about 80–95% reflective.

29. The pulse stretcher of claim 27, wherein the beam recirculates through the beamsplitter and the prism using at least two helical paths.

30. The pulse stretcher of claim 27, wherein the beam recirculates through beamsplitter and the prism using at least four helical paths.

31. The pulse stretcher of claim 27, wherein the plurality of mirrors includes at least one convex mirror.

32. The pulse stretcher of claim 27, wherein the plurality of mirrors includes at least one concave mirror.

33. The pulse stretcher of claim 27, wherein the beamsplitter and the prism and the reflective element form a unitary component.

34. The pulse stretcher of claim 27, wherein the prism has at least one powered surface for telescoping the beam to a desired size.

35. The pulse stretcher of claim 27, wherein the plurality of mirrors includes at least two convex mirrors.

36. The pulse stretcher of claim 27, wherein the plurality of mirrors includes at least two concave mirrors.

37. The pulse stretcher of claim 27, wherein the beamsplitter comprises a second prism optically coupled to a coupling prism using the partially reflective interface that directs the beam towards the first prism.

38. The pulse stretcher of claim 27, wherein the helical path includes two left handed helixes, and two right handed helixes.

39. A lithographic system comprising, in order of light propagation:
   an illumination source;
   a pulse stretcher;
   illumination optics;
   a reticle; and
   projection optics,
   wherein the pulse stretcher comprises:
      a beamsplitter and a prism positioned opposite each other, wherein the beamsplitter includes a partially reflective interface that directs a beam towards the prism,
      a reflective element that reflects a beam from the beamsplitter into the prism, and
      a plurality of mirrors positioned around the beamsplitter and the prism to permit a helical path of the beam between the beamsplitter and the prism and recirculation of the beam through the beamsplitter and the prism.

* * * * *